United States Patent
Ushiroku

[11] Patent Number: 5,831,493
[45] Date of Patent: Nov. 3, 1998

[54] SURFACE ACOUSTIC WAVE LADDER FILTER UTILIZING A GENERATED SPURIOUS COMPONENT OF THE PARALLEL ARM

[75] Inventor: Tadamasa Ushiroku, Ishikawa-ken, Japan

[73] Assignee: Murata Manufacturing Co., Ltd., Kyoto-fu, Japan

[21] Appl. No.: 696,602

[22] Filed: Aug. 14, 1996

[30] Foreign Application Priority Data

Aug. 14, 1995 [JP] Japan .................................. 7-207105

[51] Int. Cl.$^6$ ........................................... H03H 9/64
[52] U.S. Cl. ...................... 333/193; 333/195; 310/313 D
[58] Field of Search ................................. 333/193–196; 310/313 R, 313 B, 313 C, 313 D

[56] References Cited

U.S. PATENT DOCUMENTS

| | | | |
|---|---|---|---|
| 4,635,009 | 1/1987 | Ebata | 333/195 |
| 5,434,466 | 7/1995 | Hickernell et al. | 333/195 X |
| 5,666,092 | 9/1997 | Yamamoto et al. | 333/194 |

FOREIGN PATENT DOCUMENTS

| | | |
|---|---|---|
| 0600705 | 6/1994 | European Pat. Off. . |
| 0663721 | 7/1995 | European Pat. Off. . |
| 57-17217 | 1/1982 | Japan ..................................... 333/195 |
| 06-152317 a | 5/1994 | Japan ..................................... 333/193 |
| 8-125489 | 5/1996 | Japan . |

Primary Examiner—Benny T. Lee
Assistant Examiner—Barbara Summons
Attorney, Agent, or Firm—Ostrolenk, Faber, Gerb & Soffen, LLP

[57] ABSTRACT

A surface acoustic wave (SAW) filter has a ladder-shaped circuit in which first one-port SAW resonators are connected between an input terminal and an output terminal as series resonators and second one-port SAW resonators are connected as parallel resonators. The antiresonant frequency of the second one-port SAW resonators matches the resonant frequency of the first one-port SAW resonators. The distances between interdigital transducers and reflectors of the second one-port SAW resonators are specified such that a spurious component is generated at a frequency between the resonant frequency of the second one-port SAW resonators and the transmission band of the filter in order to improve attenuation characteristics in a blocking band in the vicinity of the transmission band.

12 Claims, 12 Drawing Sheets

NORMALIZED FREQUENCY

NORMALIZED FREQUENCY

5,831,493

SURFACE ACOUSTIC WAVE LADDER FILTER UTILIZING A GENERATED SPURIOUS COMPONENT OF THE PARALLEL ARM

BACKGROUND OF THE INVENTION

1. Field of the Invention

The present invention relates to a bandpass surface acoustic wave (hereinafter called SAW) filter configured with a plurality of SAW resonators, and more particularly, to a SAW filter having a ladder-shaped circuit.

2. Description of the Related Art

SAW bandpass filters configured with a ladder-shaped circuit using a plurality of SAW resonators are disclosed in Japanese Examined Patent Publication No. 56-19765 and Japanese Unexamined Patent Publication No. 5-183380. Such a SAW filter will be described below by referring to FIG. 1.

In a SAW filter 1 shown in FIG. 1, a plurality of SAW resonators are configured by creating various electrodes on a rectangular piezoelectric substrate 2. One-port SAW resonators 3 and 4 are connected in series between an input terminal IN and an output terminal OUT as series resonators. One-port SAW resonators 5 and 6 are connected at two parallel arms of the circuit, that is, between the input and output terminals and a reference-voltage point, respectively, as parallel resonators.

The one-port SAW resonators 3 to 6 have interdigital transducers (hereinafter called IDTs) 3a, 4a, 5a and 6a, and grating reflectors 3b, 3c, 4b, 4c, 5b, 5c, 6b, and 6c disposed at both sides of the IDTs 3a to 6a, that is, in both directions in which the surface waves generated by the IDTs transfer.

One of the comb electrodes of the IDT 3a is connected to the input terminal IN, and the other comb electrode is electrically connected to one of the comb electrodes of the IDT 5a, and is also connected to one of the comb electrodes of the IDT 4a through a connection electrode 7. The other electrode of the IDT 4a is connected to the output terminal OUT and is also electrically connected to one of the comb electrodes of the IDT 6a through a connection electrode 8.

The other electrodes of the IDT 5a and the IDT 6a are connected to ground. Therefore, a ladder-shaped circuit is configured such that the one-port SAW resonators 3 and 4 are connected in series between the input terminal IN and the output terminal OUT to form a series arm of the circuit, and the parallel resonators 5 and 6 are connected in parallel between the above-mentioned series arm and the reference voltage.

The SAW resonators 3 to 6 are formed together with the connection electrodes 7 and 8 on the piezoelectric substrate 2 with the use of metallic materials such as aluminum.

In the SAW filter 1, the resonant frequencies of the SAW resonators 3 and 4 serving as series resonators match the anti-resonant frequencies of the SAW resonators 5 and 6 serving as parallel resonators, enabling the whole circuit to obtain bandpass filter characteristics. By referring to FIGS. 2 and 3, this feature of the invention will be described.

FIG. 2 is a plan view typically showing the electrode structure of a one-port SAW resonator. In an SAW resonator 9, an IDT 10 is formed at the center. The IDT 10 includes a pair of comb electrodes 10a and 10b. The comb electrodes 10a and 10b have a plurality of interleaved electrode fingers. At both sides of the IDT 10 in the directions in which a surface wave transfers, reflectors 11 and 12 are disposed. The reflectors 11 and 12 have a plurality of electrode fingers extending in the direction perpendicular to the directions in which the surface wave transfers, and the plurality of electrode fingers are connected at both ends.

When a signal is applied between the comb electrode 10a and the comb electrode 10b in the IDT 10, a surface wave is excited and the excited surface wave is trapped between the reflectors 11 and 12, disposed at both sides. Therefore, a resonator having a high Q value can be implemented.

The SAW resonator 9 is indicated by the circuit symbol shown in FIG. 3A, and has the impedance-frequency characteristics shown in FIG. 3B. As shown in FIG. 3B, the impedance is low near the resonant frequency fr and is very high at the antiresonant frequency fa. Therefore, in a circuit in which the SAW resonators 9 are connected in a ladder-shaped manner like the SAW resonators 3 to 6 described above, when the resonant frequencies of the series resonators and the antiresonant frequencies of the parallel resonators match, the input/output impedance matches the characteristic impedance near the resonant frequency, and a transmission band is created.

In the impedance-frequency characteristics of the SAW filter 1, the impedance is very high near the antiresonant frequency of the series resonators and the impedance is very low near the resonant frequency of the parallel resonators. Therefore, attenuation poles can be formed at these frequencies.

According to the configuration described above, bandpass filter characteristics can be obtained which have low insertion loss and a relatively large attenuation at blocking bands which may be in the vicinity of the transmission band.

Thus, the SAW filter 1 advantageously has a large attenuation at the blocking bands which are near the transmission band. However, recently in communication apparatuses such as portable telephones, for example, the interval between the transmitting frequency and the receiving frequency is substantially narrowed in order to increase radio spectrum utilization efficiency. Therefore, the known SAW filter may no longer have sufficient selectivity, and there is a demand for a bandpass filter having steeper filter characteristics between the transmission band and the blocking bands.

To make the filter characteristics (in particular the attenuation characteristics) of a ladder-shaped filter between the transmitting frequency and the receiving frequency steeper, a method can be used in which the number of resonators is increased and the number of resonator stages is also increased. This method is usually applied to a piezoelectric filter or the like. When the number of stages is increased, the resistance of the electrodes increases as the number of components increases, and insertion loss becomes larger. Since the arrangement of electrodes on a piezoelectric substrate becomes complicated, the manufacturing process may become complex and the piezoelectric substrate may have to be large in size. Therefore, there is a limit to this method, in which the number of stages is increased. Hence, there is a demand for a method of making the attenuation characteristics at the boundaries between the transmission band and the blocking bands steeper without increasing the number of stages.

SUMMARY OF THE INVENTION

Accordingly, it is an object of the present invention to provide a ladder-shaped SAW filter using SAW resonators and having steeper attenuation characteristics at the boundaries between the transmission band and the blocking bands without increasing the number of stages.

The present invention is made in order to accomplish the foregoing object. It relates to a SAW filter having a ladder-shaped circuit in which a series arm is formed between an input and an output, and at least one parallel arm is formed between the series arm and a reference-voltage point. A SAW filter of the present invention has at least one first one-port SAW resonator connected at the series arm as a series resonator and a second one-port SAW resonator connected at the parallel arm. Each one-port SAW resonator has an IDT and reflectors provided at both sides of the IDT. A resonator having a number of pairs of IDTs and not having a reflector may be used as a series resonator. A parallel resonator, namely, the second one-port SAW resonator connected to the parallel arm has an antiresonant frequency which is substantially the same as the resonant frequency of the series resonator, namely, the first one-port SAW resonator. The expression "substantially the same" includes a case in which two things are sufficiently in proximity to achieve the objects of the invention, in addition to a case in which they are completely the same.

Since the SAW filter of the present invention has a ladder-shaped circuit in which the first and second one-port SAW resonators are connected respectively as a series resonator and a parallel resonator, bandpass filter characteristics having attenuation poles at the antiresonant frequency of the series resonator and the resonant frequency of the parallel resonator are obtained, in the same way as in the conventional SAW filter.

In the conventional ladder-shaped circuit, the distance between the IDT and a reflector of the second one-port SAW resonator serving as a parallel resonator is usually set to $\lambda/2$ where $\lambda$ indicates the wavelength of an excited surface wave. If the distance between the IDT and the reflector becomes more than $\lambda/2$ or less than $\lambda/2$, a spurious component which cannot be ignored is generated between the resonant frequency and the antiresonant frequency of the second one-port SAW resonator. Therefore, the distance between an IDT and a reflector is conventionally set to $\lambda/2$ in order to suppress this unwanted spurious component.

Noticing that the frequency where the above-described spurious component is generated changes according to the distance between an IDT and a reflector, the inventors found that by using this spurious component, attenuation can be increased in blocking bands in a frequency zone in the vicinity of the transmission band. That discovery was part of this invention.

According to one aspect of the present invention, the distance between the IDT and the reflectors in the second one-port SAW resonator is specified such that the spurious component is generated between the resonant frequency of the second one-port SAW resonator and the transmission band of the SAW filter. Therefore, attenuation is substantially increased at a frequency zone in the vicinity of the transmission band, in the lower-frequency blocking band of the transmission band, as will be clearly understood from the embodiments to be described later.

As described above, the spurious component needs to be generated at an appropriate frequency in order to increase attenuation in the vicinity of the transmission band, in the lower-frequency blocking band of the transmission band. If the spurious component is generated at a too-high frequency, a ripple occurs in the transmission band and insertion loss is increased. If the spurious component is generated at a too-low frequency, the spurious component is included in the resonant characteristics of the SAW resonator and no advantage may be obtained from the generation of the spurious component.

Therefore in this aspect of the present invention, the spurious component needs to be generated at a frequency higher than the resonant frequency of the parallel resonator, namely, the second one-port SAW resonator, since a higher steepness is used than that of the impedance changes in the main resonance. The spurious component has to be generated at a lower frequency than the transmission band so as not to increase insertion loss. Therefore, the distance between the IDT and the reflectors is specified such that the spurious component is generated between the resonant frequency of the second one-port SAW resonator and the transmission band.

More specifically, to significantly increase attenuation, the distance r between the center of the electrode finger which is closest to the reflector in the IDT of the second one-port SAW resonator and the center of the electrode finger which is closest to the IDT in the reflector is set to less than $0.50\lambda$, whereby attenuation is positively increased in the vicinity of the transmission band in the lower-frequency blocking band of the transmission band.

Since in this aspect of the present invention, the distance between the IDT and the reflectors of the second one-port SAW resonator is specified such that the spurious component is generated between the resonant frequency of the second one-port SAW resonator and the transmission band of the SAW filter, attenuation can be increased in the vicinity of the transmission band in the lower-frequency blocking band of the transmission band. Therefore, steepness of the attenuation characteristics at the boundary between the transmission band and the lower-frequency blocking band can be effectively increased. A bandpass filter having a narrow frequency interval between the transmission band and the lower-frequency blocking band and having a superior selection level can be achieved. Such a filter is suited to a portable telephone filter having a narrow frequency interval.

According to another aspect of the present invention, the distance between the IDT and the reflectors of the second one-port SAW resonator is specified such that a spurious component generated between the resonant frequency and the antiresonant frequency in the second one-port SAW resonator is generated between the antiresonant frequency of the first one-port SAW resonators and the transmission band of the SAW filter.

Attenuation at the higher-frequency blocking band of the transmission band is obtained with an attenuation pole being at the antiresonant frequency of a series resonator, namely, the first one-port SAW resonator. The above-described spurious component of the second one-port SAW resonator is used to increase attenuation at a frequency zone in which signals cannot be attenuated by the antiresonant characteristics of the first one-port SAW resonator. In other words, the spurious component generated in the second one-port SAW resonator is used in order to increase attenuation in a frequency zone very close to the transmission band in the higher-frequency blocking band of the transmission band.

Also in this aspect of the present invention, when the spurious component is generated in the transmission band, a ripple occurs and the insertion loss in the transmission band is increased. Therefore, the spurious component is generated at a frequency lower than the antiresonant frequency of the series resonators and higher than the transmission band.

Also in this aspect of the present invention, by adjusting the distance between the IDT and the reflectors in the second one-port SAW resonator, the spurious component generated at the second one-port SAW resonator is generated between the antiresonant frequency of the first one-port SAW resonator and the transmission band. Attenuation can be thereby substantially increased in the vicinity of the transmission band in the higher-frequency blocking band.

More specifically, in this aspect of the present invention, the distance r between the center of the electrode finger which is closest to the reflector in the IDT of the second one-port SAW resonator and the center of the electrode finger which is closest to the IDT in the reflector is set to more than $0.50\lambda$, and attenuation is thereby positively increased in the vicinity of the transmission band in the higher-frequency blocking band.

Since in this aspect of the present invention, the distance between the IDT and the reflectors of the second one-port SAW resonator is specified such that the spurious component is generated between the antiresonant frequency of the first one-port SAW resonator and the transmission band of the SAW filter, attenuation can be substantially increased at a frequency area in the vicinity of the transmission band, in the higher-frequency blocking band of the transmission band. Therefore, steepness of the attenuation characteristics at the boundary between the transmission band and the higher-frequency blocking band can be effectively increased. A bandpass filter having superior selectivity can be offered. A filter apparatus suited to applications in which there is a narrow frequency interval between the transmission band and a blocking band, such as a portable telephone, can be implemented.

The first aspect and the second aspect of the present invention can be combined. The distances between the IDTs and the reflectors in a plurality of second one-port SAW resonators can be specified such that the conditions used in both the first and the second aspects of the present invention are satisfied. In this case, attenuation can be effectively increased in the vicinity of the transmission band in the blocking bands disposed at both sides of the transmission band without increasing insertion loss.

The SAW filters according to the first and second aspects of the present invention can be formed as single parts by forming a plurality of one-port SAW resonators on a single surface-wave substrate. The SAW filters according to the present invention may also be configured by forming each one-port SAW resonator on a different respective surface-wave substrate as a different part, and then electrically connecting all of the resonators.

The above-described surface-wave substrate broadly includes surface-wave substrates having suitable structures as are conventionally used in SAW apparatuses, such as a dielectric substrate on which a piezoelectric thin film is formed, in addition to a piezoelectric substrate. When a piezoelectric substrate is used, electrodes such as those of each one-port SAW resonator are formed on the substrate. When a dielectric substrate with a piezoelectric thin film is used, the electrodes may be formed on the lower surface of the piezoelectric thin film as well as on the upper surface of the piezoelectric thin film.

DESCRIPTION OF PREFERRED EMBODIMENTS

Embodiments of the present invention will be described below by referring to the figures.

First embodiment

Figure 1:
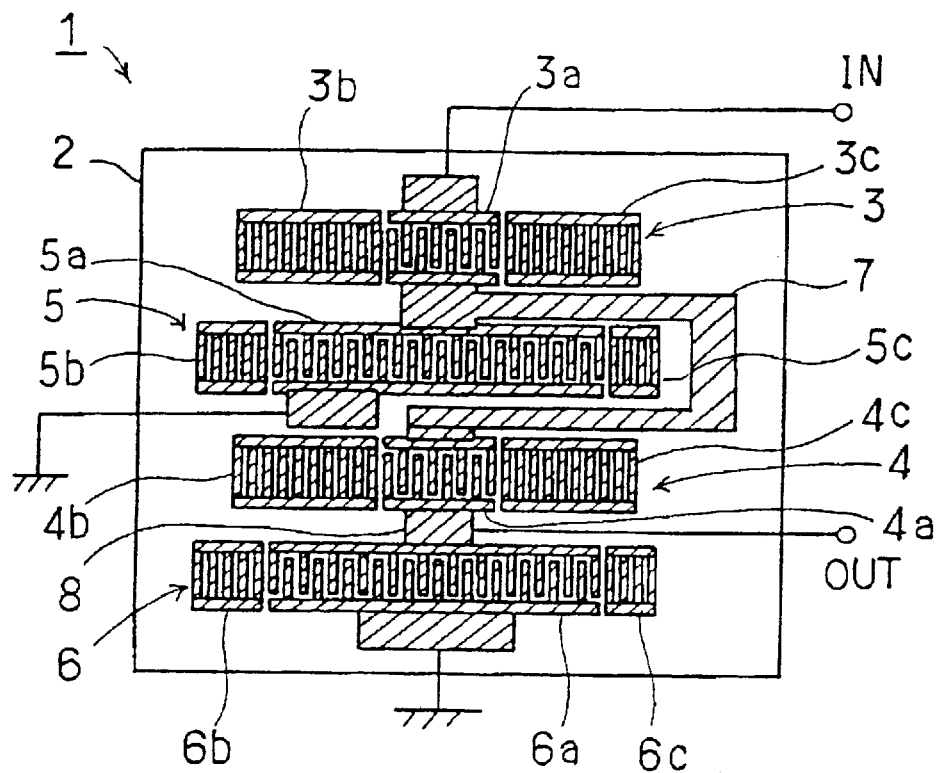
FIG. 1 is a plan of the electrode structure of a conventional ladder-shaped SAW filter.
Figure 2:
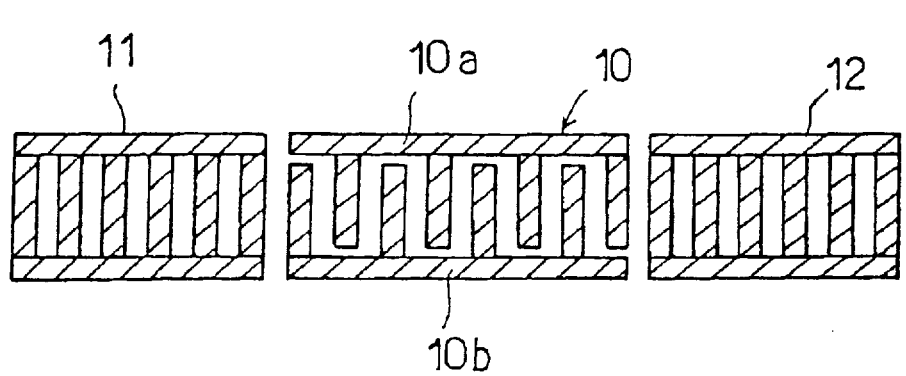
FIG. 2 is a plan view of a conventional SAW resonator used in the SAW filter.
Figure 3:
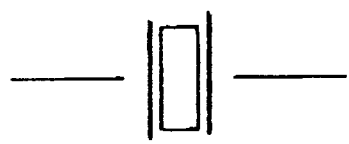
FIG. 3A indicates the circuit symbol of a SAW resonator.
FIG. 3B shows the impedance-frequency characteristics of the conventional SAW resonator.
Figure 3B:
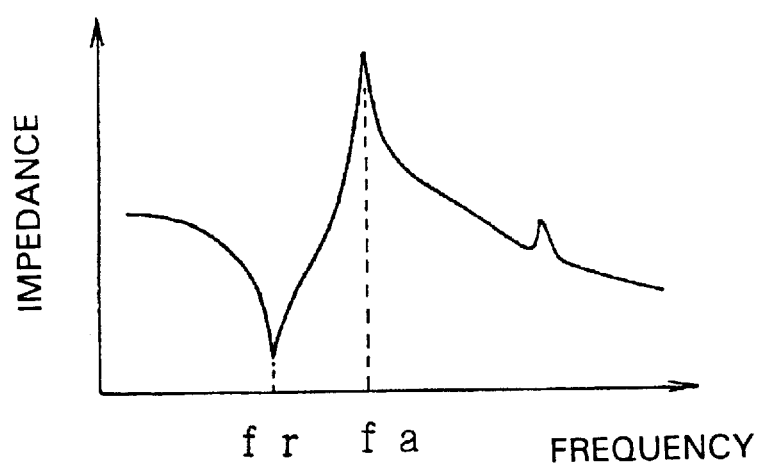
Figure 4:
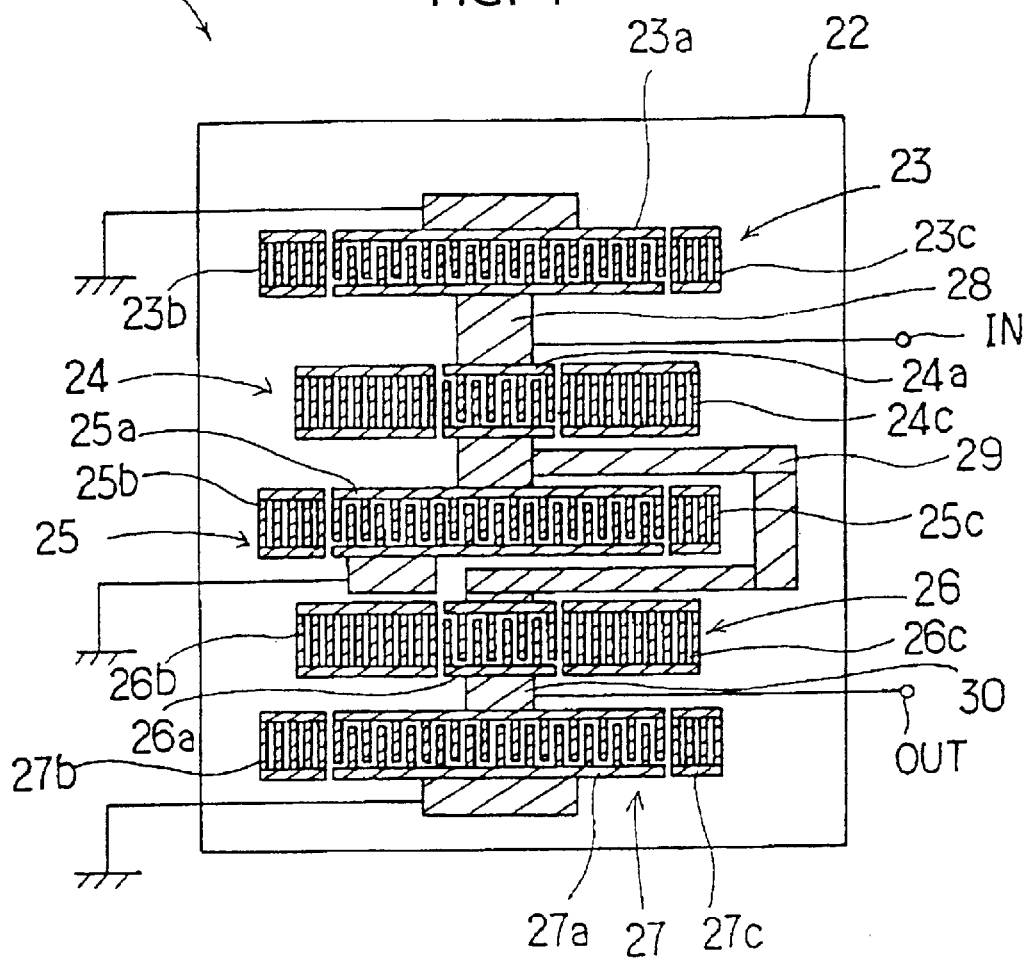
FIG. 4 is a plan view of a SAW filter according to a first embodiment.

FIG. 4 is a plan view of a SAW filter according to a first embodiment of the present invention. A SAW filter 21 is formed with the use of a rectangular surface-wave substrate 22. The surface-wave substrate 22 is made up of a 36-degree-rotation-Y-cut $L_iT_aO_3$ piezoelectric plate.

On the surface-wave substrate 22, one-port SAW resonators 23 to 27 are formed. The one-port SAW resonators 23 to 27 have IDTs 23a to 27a at their centers and grating reflectors 23b, 23c, 24b, 24c, 25b, 25c, 26b, 26c, 27b, and 27c having a plurality of electrode fingers, at both sides of the IDTs 23a to 27a.

The SAW filter 21 is connected to an input terminal IN and an output terminal OUT. Between the input terminal IN and the output terminal OUT, a series arm is formed. SAW resonators 24 and 26 are connected to form the series arm as series resonators. Between the series arm and a reference-voltage point, three parallel arms are formed. SAW resonators 23, 25, and 27 are connected between the series arm and the reference-voltage point as parallel resonators.

One of the comb electrodes of the IDT 23a in the SAW resonator 23 is connected to one of the comb electrodes of the IDT 24a in the SAW resonator 24 through a connection electrode 28. The other comb electrode of the IDT 24a is connected to one of the comb electrodes of the IDT 25a, and to one of the comb electrodes of the IDT 26a through a connection electrode 29. Through a connection electrode 30, the other comb electrode of the IDT 26a is electrically connected to one of the comb electrodes of the IDT 27a.

Figure 7:
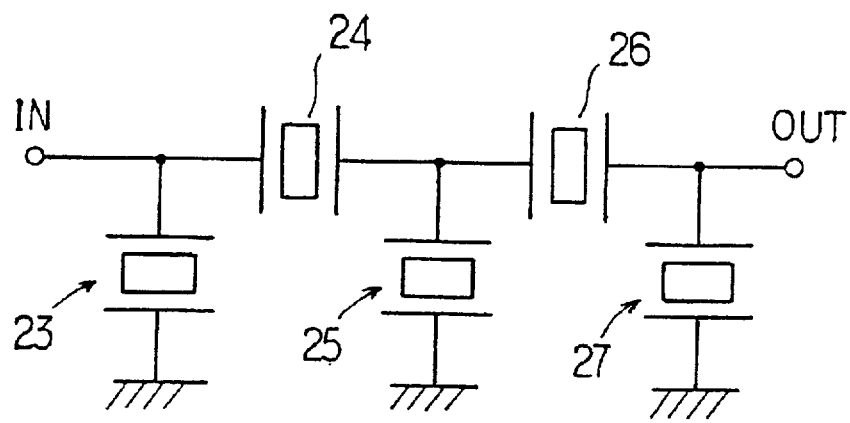
FIG. 7 is a circuit diagram of the SAW filter according to the first embodiment.

The other comb electrodes of the IDTs 23a, 25a, and 27a are connected to the reference voltage. Therefore, the SAW filter 21 according to this embodiment has the ladder-shaped equivalent circuit shown in FIG. 7.

The SAW resonators 23 to 27 and the electrodes such as the connection electrodes 28 to 30 can be formed by applying metallic materials, such as aluminum, to the surface-wave substrate 22 by an appropriate method. The electrode structure shown in FIG. 4 can be formed by, for example, applying the photolithography technology to aluminum to be formed on the whole area of the substrate. Alternatively, the electrode structure can be obtained by forming electrically conductive materials such as aluminum on the piezoelectric substrate 22 using masks in a method such as deposition, sputtering, or other methods.

In FIG. 4, the structure of the electrodes of the SAW resonators 23 to 27, such as the number of electrode fingers and their lengths, is roughly shown.

The SAW resonators 23 to 27 are configured as listed in Table 1 below.

TABLE 1

| SAW Resonators | No. of reflectors | No. of IDT pairs | Intersection width ($\mu$m) | IDT wavelength $\lambda$ ($\mu$m) | IDT-reflector distance |
|---|---|---|---|---|---|
| 23, 27 | 100 | 50 | 60 | 4.303 | 0.46$\lambda$ |
| 24, 26 | 100 | 95 | 50 | 4.142 | 0.50$\lambda$ |
| 25 | 50 | 120 | 120 | 4.327 | 0.43$\lambda$ |

The antiresonant frequency of the parallel resonators, the SAW resonators 23, 25, and 27, matches the resonant frequency of the SAW resonators 24 and 26. Therefore, the SAW filter 21 operates as a bandpass filter since it has the ladder-shaped circuit shown in FIG. 7.

The SAW resonators 23 to 27 are configured such that they have the distances between their IDTs and reflectors, specified in Table 1. The SAW resonators 24 and 26 serving as series resonators have a distance of 0.50$\lambda$ between the IDTs 24a and 26a and the reflectors 24b, 24c, 26b, and 26c, respectively. In contrast, the SAW resonators 23, 25, and 27 serving as parallel resonators have distances less than 0.50$\lambda$. Therefore, in the SAW resonators 23, 25, and 27, a spurious component to be generated between the resonant frequency and the antiresonant frequency is specified between the resonant frequency of the SAW resonators 23, 25, and 27 and the transmission band of the SAW filter 21. Attenuation can be substantially improved in the vicinity of the transmission band in the lower-frequency blocking band of the transmission band. This feature will be described below in detail.

Figure 5:
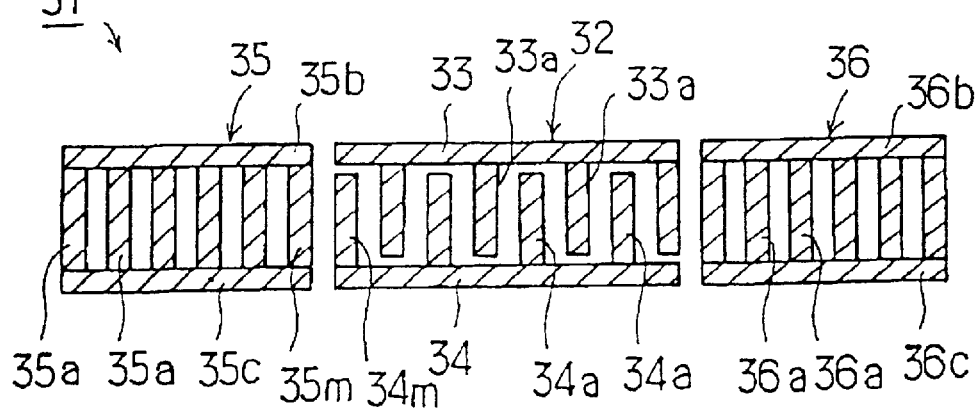
FIG. 5 is a plan view of a SAW resonator used in the first embodiment.

FIG. 5 is a plan view of an SAW resonator for serving as a parallel resonator. An SAW resonator 31 has an IDT 32 at the center. The IDT 32 includes a pair of comb electrodes 33 and 34. The comb electrodes 33 and 34 have a plurality of electrode fingers 33a and 34a, respectively. The plurality of electrode fingers 33a and the plurality of electrode fingers 34a are disposed such that they are interleaved with each other. The pitch of the electrode fingers in the IDT 32 is set to 0.50$\lambda$, where $\lambda$ indicates the wavelength of an excited surface wave.

Reflectors 35 and 36 are disposed at both sides of the IDT 32. The reflectors 35 and 36 have a plurality of electrode fingers 35a and 36a, respectively. The plurality of electrode fingers 35a are connected in common at both ends by common electrodes 35b and 35c. In the same way, the plurality of electrode fingers 36a are connected in common at both ends by common electrodes 36b and 36c. The pitch of the electrode fingers is set to 0.50$\lambda$ also in the reflectors 35 and 36.

Figure 6:
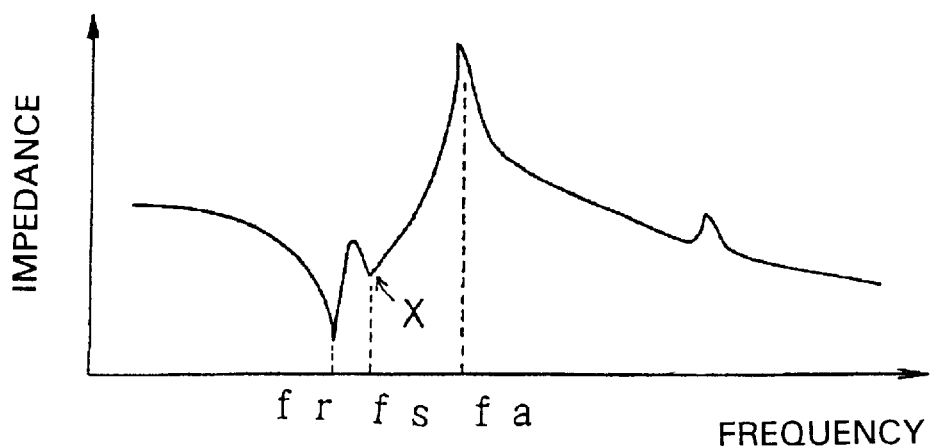
FIG. 6 shows the impedance-frequency characteristics of the SAW resonator shown in FIG. 5.

When the SAW resonator 31 is used as a parallel resonator, if the distance between the IDT 32 and the reflectors 35 and 36 is changed, a relatively large spurious component X is generated at a frequency between the resonant frequency $f_r$ and the antiresonant frequency $f_a$ as shown in FIG. 6. The frequency where this spurious component is generated is called $f_s$ hereinafter. Conventionally, the distance r between the IDT 32 and the reflectors 35 and 36 is set to 0.50$\lambda$ so as not to generate the spurious component X. The distance r between the IDT and a reflector indicates, when the reflector 35 is taken as an example, the distance between the center of the electrode finger 34m which is closest to the reflector 35 among the electrode fingers of the IDT 32 and the center of the electrode finger 35m which is closest to the IDT 32 among the electrode fingers of the reflector 35. It has been said that the spurious component X can be suppressed by determining the distance between the IDT 32 and the reflector 35 such that the distance r between the centers of these electrode fingers is 0.50$\lambda$.

Figure 8:
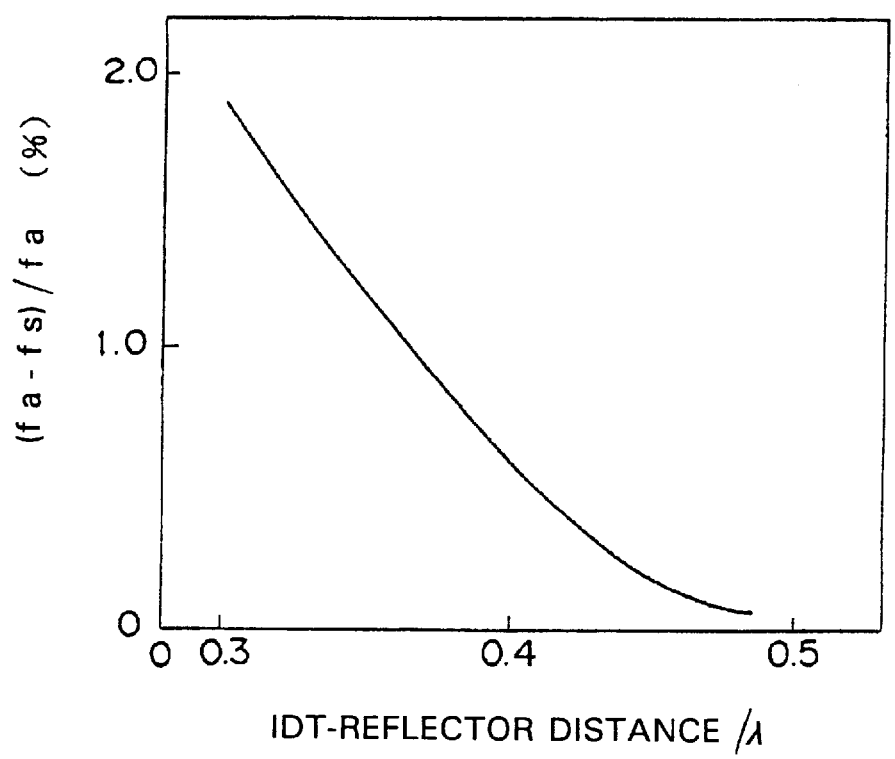
FIG. 8 shows a relationship between the distance r between the centers of electrode fingers in an IDT and a reflector, and the frequency where a spurious component is generated.

Thinking that attenuation in blocking bands could be increased by using the spurious component X, the inventors studied a change of the frequency $f_s$ where the spurious component X is generated by changing the distance between the IDT 32 and the reflector 35 from 0.50$\lambda$ to a smaller value. As a result, as shown in FIG. 8, it was found that the spurious-component generation frequency $f_s$ decreases as the distance r between the IDT 32 and the reflector 35 is reduced below 0.50$\lambda$. Therefore, by adjusting the distance r, the spurious component X can be generated at any frequency.

To use the spurious component in order to increase attenuation, it is necessary to generate the component at the desired frequency. In other words, when the spurious-component generation frequency $f_s$ is too high, a ripple occurs in the transmission band and insertion loss is made larger. When the spurious-component generation frequency $f_s$ is too low, the spurious component is included in the resonant characteristics of the SAW resonator 31 and attenuation cannot be increased.

Since the SAW filter 21 according to this embodiment has higher steepness than that of the impedance change in the main resonance, the spurious-component generation frequency $f_s$ needs to be set to a higher frequency than the resonant frequency of a parallel resonator. The spurious-component generation frequency also needs to be set to a lower frequency than the transmission band in order not to increase insertion loss. Therefore, the spurious-component generation frequency $f_s$ is set between the resonant frequency of the parallel resonator and the transmission band.

From the viewpoint described above, in the SAW filter 21 according to the present embodiment, the distances r between the IDTs and reflectors in the parallel resonators 23, 25, and 27 are set as shown in Table 1. The distances r between the IDTs and the reflectors are set to 0.46λ in the SAW resonators 23 and 27, and the distance r is set to 0.43λ, which is smaller than 0.50λ, in the SAW resonator 25. In the SAW resonators 24 and 26 serving as series resonators, the distances r between the IDTs and the reflectors are set to 0.50λ.

Figure 9:
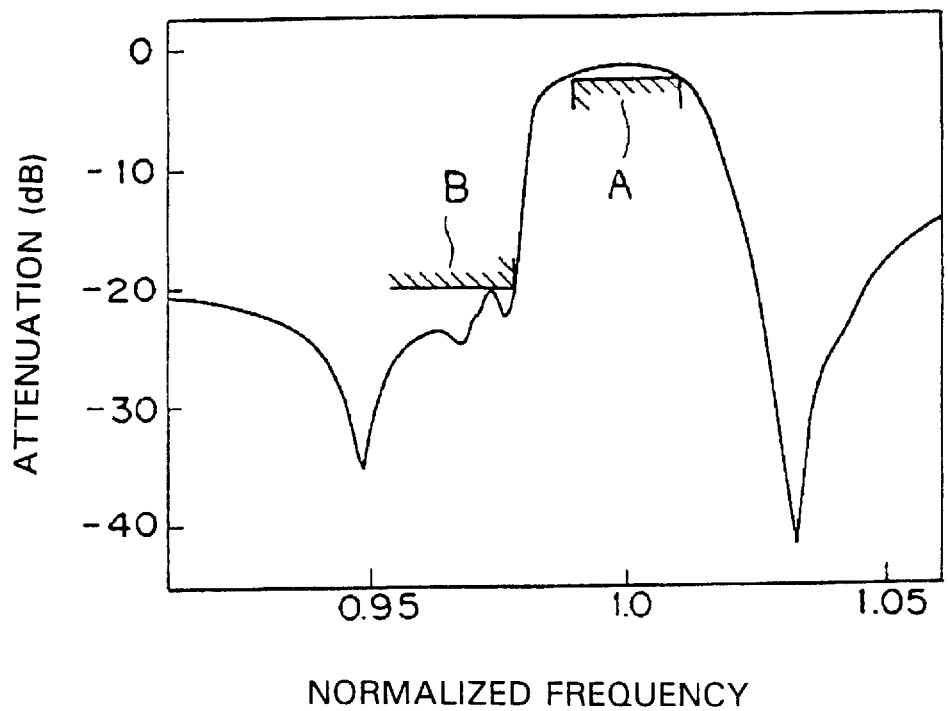
FIG. 9 shows the frequency characteristics of the SAW filter according to the first embodiment.

FIG. 9 shows the filter characteristics of the SAW filter 21 configured as described above according to the present embodiment.

Figure 10:
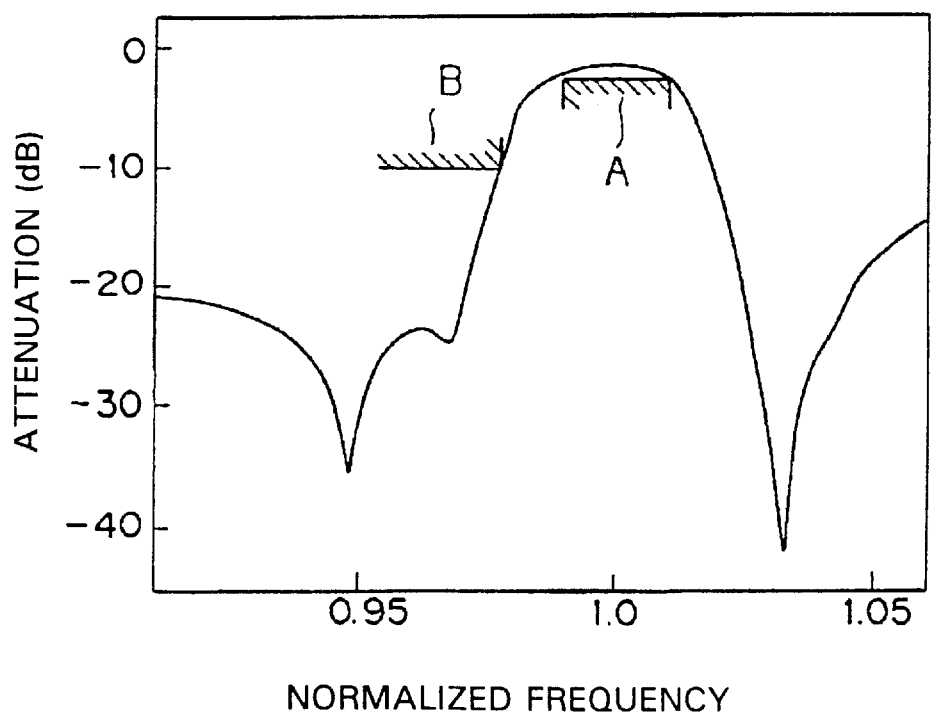
FIG. 10 shows the frequency characteristics of a conventional SAW filter.

For comparison, the filter characteristic of an SAW filter which is configured in the same way as the SAW filter 21 of the present embodiment except that the distances between the IDTs and the reflectors are set to 0.50λ in the SAW resonators 23 to 27 is shown in FIG. 10.

It is clearly understood from a comparison between the frequency characteristics shown in FIGS. 9 and 10 that attenuation can be increased in the vicinity of the transmission band in the lower-frequency blocking band of the transmission band. At the boundary between the transmission band (indicated by area A hatched by diagonal lines) and the lower-frequency blocking band (indicated by area B hatched by diagonal lines) of the transmission band in FIGS. 9 and 10, it is found that steepness of the filter characteristics can be effectively increased. Therefore, a bandpass filter having a superior selectivity can be offered.

Second embodiment

Figure 11:
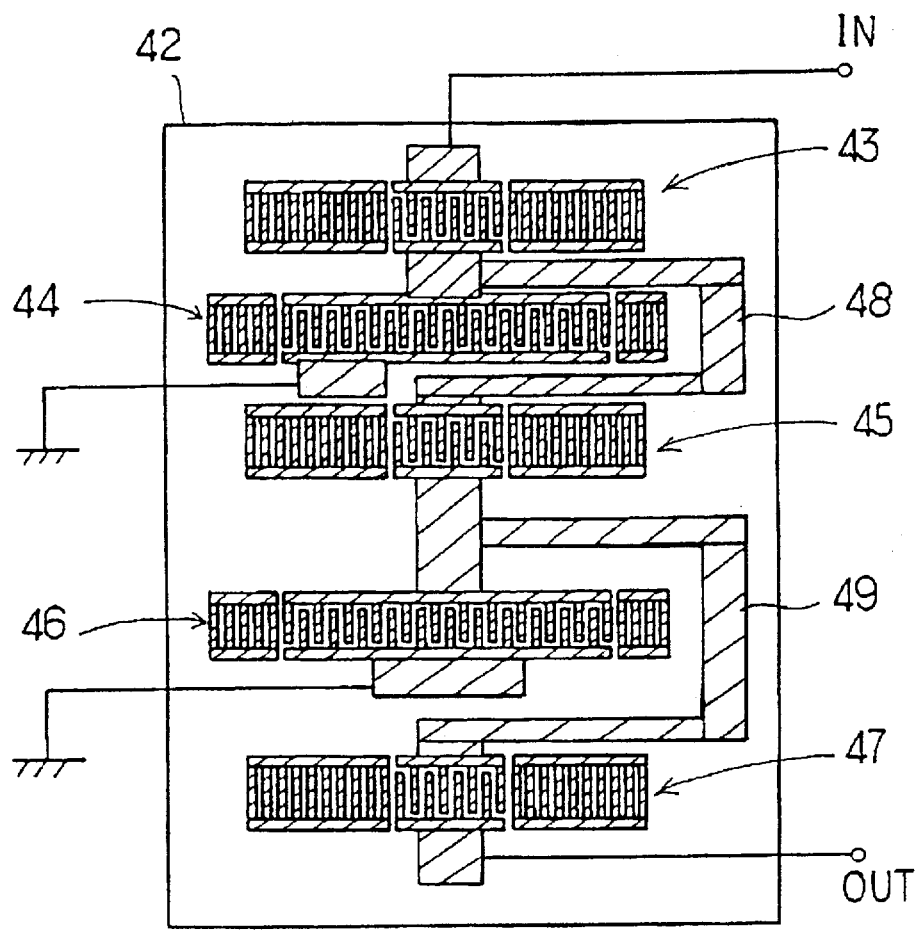
FIG. 11 is a plan view of a SAW filter according to a second embodiment.

FIG. 11 is a plan view of an SAW filter 41 according to a second embodiment of the present invention. The SAW filter 41 is formed with five one-port SAW resonators 43 to 47 disposed on a surface-wave substrate 42 made from a 36-degree-rotation-Y-cut $L_iT_aO_3$ piezoelectric plate. Connection electrodes 48 and 49 are formed on the surface-wave substrate 42. The electrodes of the one-port SAW resonators 43 to 47 are configured in the same way as in the SAW resonators 23 to 27 described in the first embodiment except for the distances between IDTs and reflectors.

Figure 14:
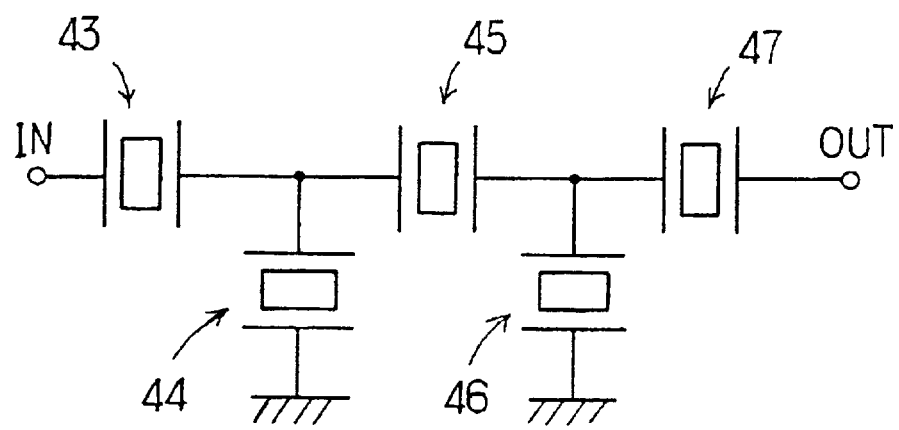
FIG. 14 is a circuit diagram showing the configuration of the SAW filter according to the second embodiment.

In this embodiment, SAW resonators 43, 45, and 47 are connected between an input terminal IN and an output terminal OUT as series resonators. Between a reference-voltage point and a series arm formed between the input and output terminals, SAW resonators 44 and 46 are also connected as parallel resonators. Therefore, as shown in FIG. 14, a two-and-a-half-stage ladder-shaped circuit having three series resonators and two parallel resonators is configured.

The antiresonant frequency of the SAW resonators 44 and 46 matches the resonant frequency of the SAW resonators 43, 45, and 47.

The SAW resonators 43 to 47 are formed as shown in Table 2 in the SAW filter 41 according to the present embodiment.

TABLE 2

| SAW Resonators | No. of reflectors | No. of IDT pairs | Inter-section width (μm) | IDT wave-length λ (μm) | IDT-reflector distance |
|---|---|---|---|---|---|
| 43, 47 | 100 | 120 | 100 | 4.422 | 0.50λ |
| 44, 46 | 80 | 80 | 120 | 4.591 | 0.60λ |
| 45 | 100 | 100 | 70 | 4.403 | 0.50λ |

While the distances r between the IDTs and the reflectors are set to 0.50λ in the series resonators 43, 45, and 47, the distance r is set to 0.6λ, which is larger than 0.50λ, in the SAW resonators 44 and 46 serving as parallel resonators.

Figure 12:
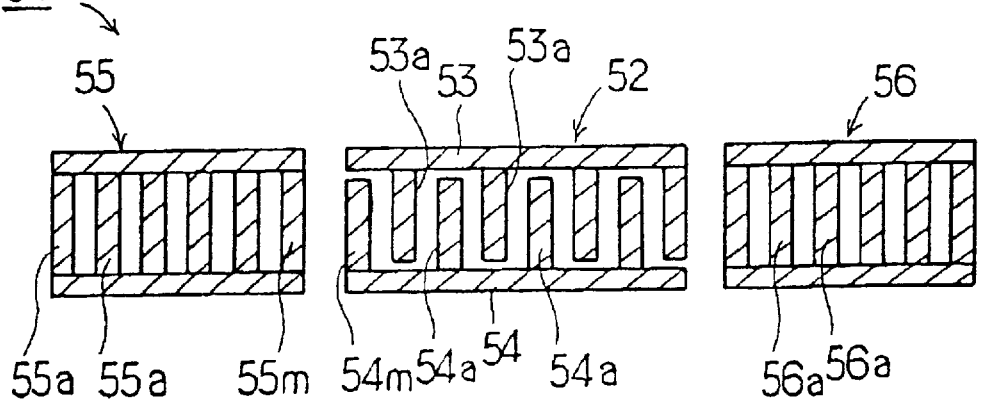
FIG. 12 is a plan view of a SAW resonator used in the second embodiment.

Since the distances between the IDTs and the reflectors are set to 0.6λ, which is larger than 0.50λ, in the SAW resonators 44 and 46, which serve as parallel resonators, attenuation in the vicinity of the transmission band in the higher-frequency blocking band can be increased. This feature will be described below by referring to FIGS. 12 and 13.

A SAW resonator 51 has an IDT 52 at the center. The IDT 52 includes a pair of comb electrodes 53 and 54. The comb electrodes 53 and 54 have a plurality of electrode fingers 53a and 54a, respectively. The pitch of the electrode fingers in the IDT 52 is set to 0.50λ.

Reflectors 55 and 56 are disposed at both sides of the IDT 52. The reflectors 55 and 56 have a plurality of electrode fingers 55a and 56a, respectively. The pitch of the electrode fingers is set to 0.50λ also in the reflectors 55 and 56.

When a voltage is applied to the comb electrodes 53 and 54 in the SAW resonator 51, a surface wave is excited and the excited surface wave is reflected between the reflectors 55 and 56, and trapped therebetween.

Figure 13:
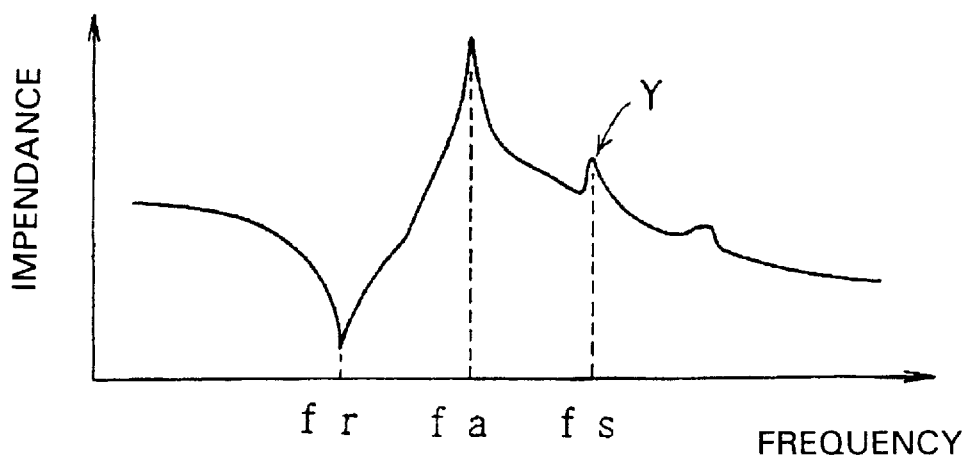
FIG. 13 shows the impedance-frequency characteristics of the SAW resonator shown in FIG. 12.

The distance r between the IDT 52 and the reflector 55, namely, the distance r between the center of the electrode finger 54m which is closest to the reflector 55 in the IDT 52 and the center of the electrode finger 55m which is closest to the IDT 52 in the reflector 55 is usually set to 0.50λ. This is because an unwanted spurious component is generated when the distance r shifts from 0.50λ. Especially when the distance r is larger than 0.50λ, a spurious component Y appears at a higher frequency than the antiresonant frequency $f_a$ in the impedance-frequency characteristics of the SAW resonator 51 as shown in FIG. 13. The frequency where the spurious component Y is generated is referred to as $f_s$ hereinafter.

Figure 15:
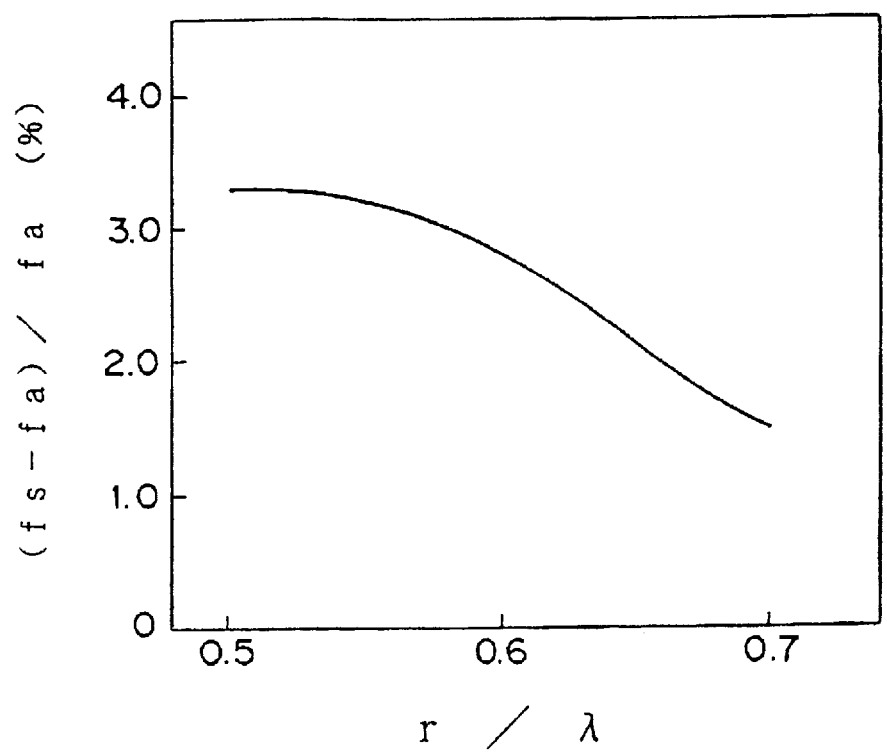
FIG. 15 shows a relationship between the distance r between the centers of electrode fingers in an IDT and a reflector, and the frequency where a spurious component is generated.

In this embodiment, attenuation is increased in the vicinity of the transmission band, in the higher-frequency blocking band of the transmission band, by the use of the spurious component Y. The inventors have learned that the frequency $f_s$ shifts as the distance r is changed as shown in FIG. 15. Therefore, it is found that, by adjusting the distance r in a range more than 0.50λ, the frequency $f_s$ can be set to the desired frequency.

Attenuation in the higher-frequency blocking band of the transmission band is obtained in the SAW filter 41 with an attenuation pole being set at the antiresonant frequency of the series resonators. In this embodiment, the spurious component Y is used to increase attenuation at a frequency zone in which signals are insufficiently attenuated by the characteristics in the vicinity of the antiresonant frequency of the series resonators, namely, at frequencies very close to the transmission band in the higher-frequency blocking band.

When the spurious component Y appears in the transmission band, a ripple occurs and insertion loss increases in the band, in the same way as in the first embodiment. Therefore, the spurious component Y needs to be generated at a frequency lower than the antiresonant frequency of the series resonators and higher than the transmission band.

It is shown in FIG. 15 that the spurious component Y can be set at the desired frequency by setting the distance r between the IDT and the reflectors in the parallel resonators to more than 0.50λ. Therefore, in the SAW filter 41, the distances between the IDTs and the reflectors in the SAW resonators 44 and 46 serving as parallel resonators are set to 0.6λ.

Figure 16:
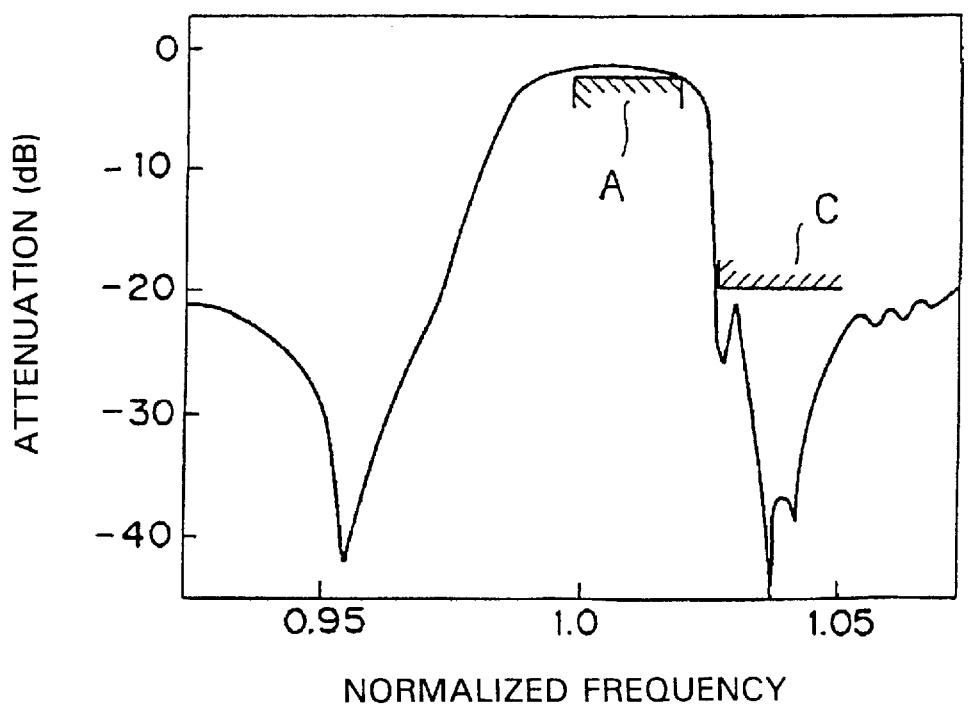
FIG. 16 shows the frequency characteristics of the SAW filter according to the second embodiment.
Figure 17:
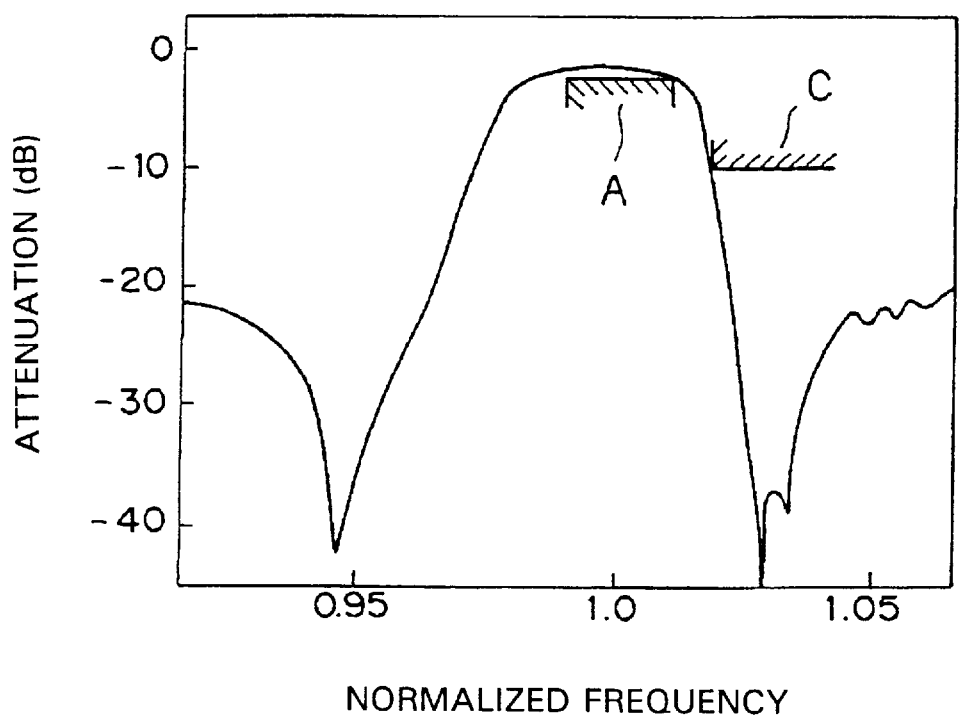
FIG. 17 shows the frequency characteristics of a conventional SAW filter.

FIG. 16 shows the filter characteristics of the SAW filter 41 according to the second embodiment. For comparison, the filter characteristics of an SAW filter which is configured in the same way as the surface-wave filter 41 except that the distances between the IDTs and the reflectors are set to 0.50 in the parallel resonators 44 and 46 is shown in FIG. 17. It is clearly understood from a comparison between the frequency characteristics shown in FIGS. 16 and 17 that attenuation is substantially increased at frequencies very close to the transmission band (indicated by area A hatched by diagonal lines) in the higher-frequency blocking band (indicated by area C hatched by diagonal lines) of the transmission band. In other words, it is found that steepness at the boundary between the transmission band and the higher-frequency blocking band is effectively increased. Therefore, a bandpass filter having a superior selection level and smaller insertion loss can be implemented.

Third embodiment

Figure 18:
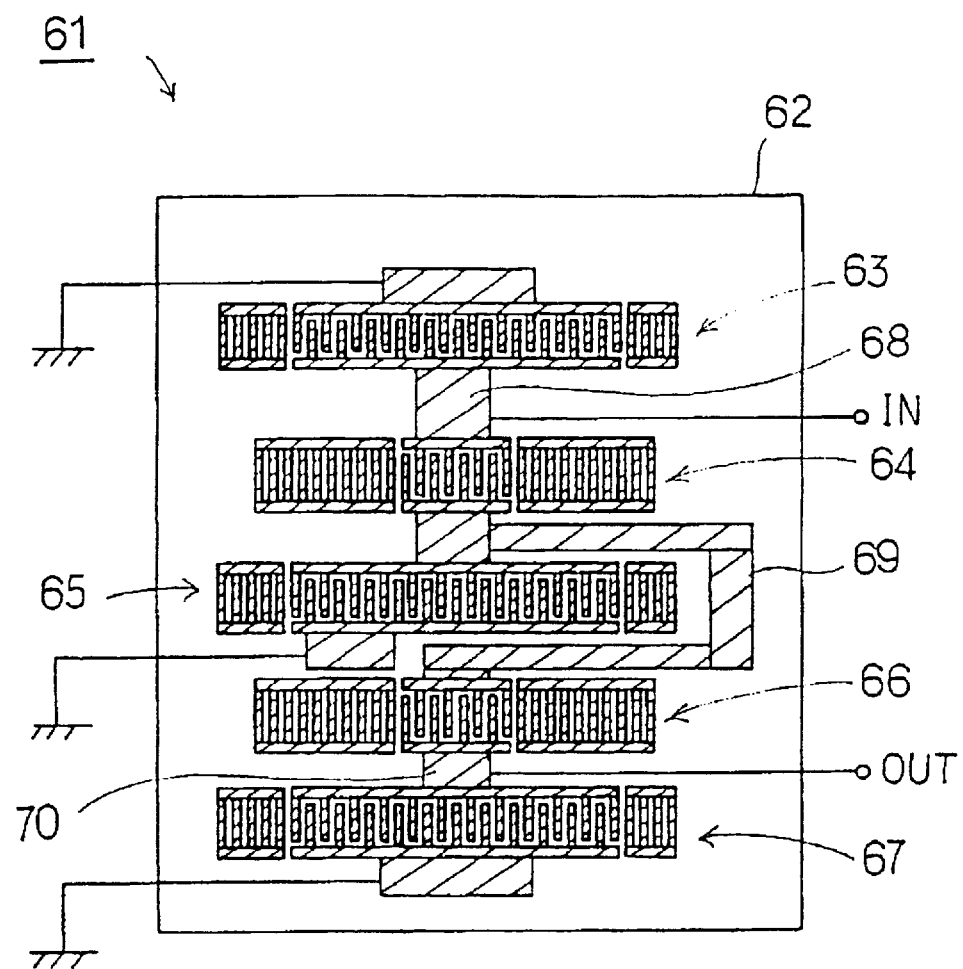
FIG. 18 is a plan view of an SAW filter according to a third embodiment.

FIG. 18 is a plan view of an SAW filter according to a third embodiment of the present invention. An SAW filter 61 includes five SAW resonators 63 to 67 disposed on a surface-wave substrate 62. The SAW filter 61 according to the third embodiment combines the filters described in the first and the second embodiments.

Between an input terminal IN and an output terminal OUT, one-port SAW resonators 64 and 66 are connected as series resonators. Parallel resonators 63, 65, and 67 are connected between the series arm and ground. There are also shown connection electrodes 68, 69, and 70.

In this embodiment, the SAW resonators 63 to 67 are set as shown in Table 3.

TABLE 3

| SAW Resonators | No. of reflectors | No. of IDT pairs | Inter- section width ($\mu$m) | IDT wave- length $\lambda$ ($\mu$m) | IDT- reflector distance |
|---|---|---|---|---|---|
| 63, 67 | 100 | 50 | 60 | 4.303 | 0.62$\lambda$ |
| 64, 66 | 100 | 95 | 50 | 4.142 | 0.50$\lambda$ |
| 65 | 50 | 120 | 120 | 4.327 | 0.43$\lambda$ |

As clearly seen in Table 3, the distances r between the IDTs and the reflectors are set to 0.50$\lambda$ in series resonators 64 and 66. In contrast, the distances r between the IDTs and the reflectors are set to 0.62$\lambda$ in the SAW resonators 63 and 67 serving as parallel resonators, and the distance between the IDT and the reflectors is set to 0.43$\lambda$ in the SAW resonator 65 serving as a parallel resonator.

Among the parallel resonators 63, 65, and 67, parallel resonator 65 corresponds to the second one-port SAW resonator in the first embodiment, and SAW resonators 63 and 67 serving as parallel resonators correspond to the second one-port SAW resonators in the second embodiment.

Figure 19:
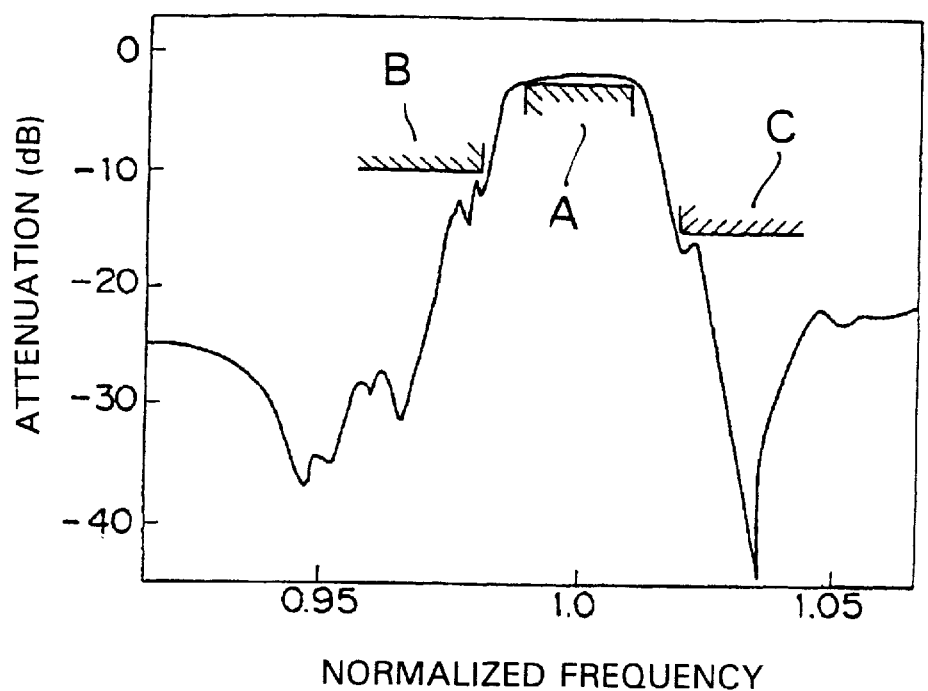
FIG. 19 shows the frequency characteristics of the SAW filter according to the third embodiment.

FIG. 19 shows the filter characteristics of the SAW filter according to the present embodiment. For comparison, the filter characteristics of a SAW filter which is configured such that the distances r between the IDTs and the reflectors are set to 0.50$\lambda$ in all the SAW resonators 63 to 67 is shown in FIG. 20.

Figure 20:
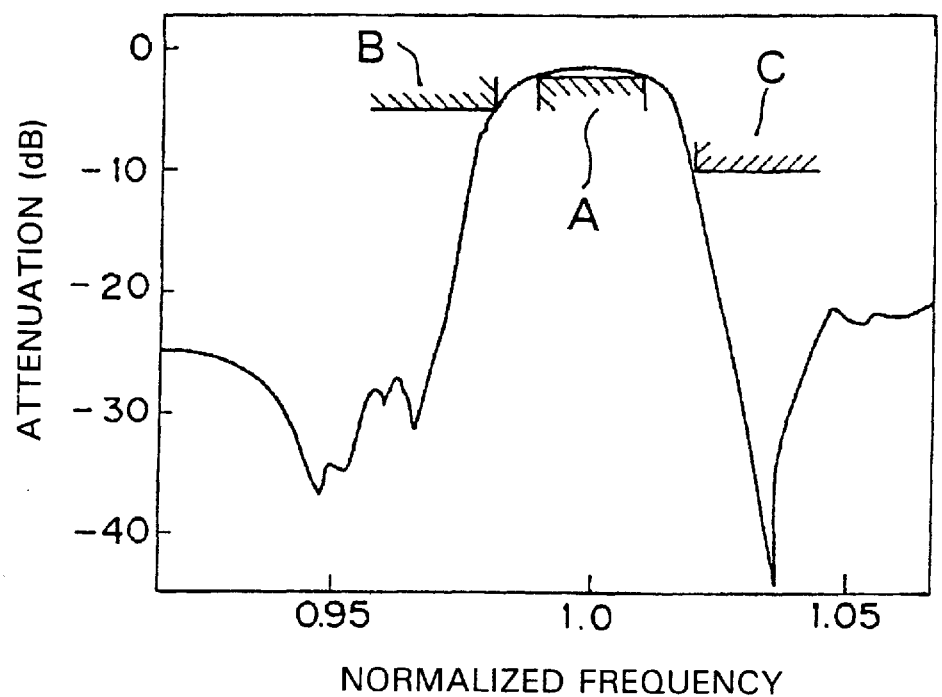
FIG. 20 shows the frequency characteristics of a conventional SAW filter.

It is clearly understood from a comparison between the filter characteristics shown in FIGS. 19 and 20 that attenuation is substantially increased in the vicinity of the transmission band (indicated by area A hatched by diagonal lines) in the blocking bands (indicated by areas B and C hatched by diagonal lines) at both sides of the transmission band. Therefore, a bandpass filter having superior selectivity and a highly steep attenuation characteristic at both sides of the transmission band can be implemented.

What is claimed is:

1. A surface acoustic wave filter having a ladder-shaped equivalent circuit, comprising:

a series arm between an input and an output, and at least one parallel arm between said series arm and a reference voltage;

said series arm including at least one first one-port SAW resonator including an interdigital transducer;

said at least one parallel arm including a second one-port SAW resonator including an interdigital transducer and reflectors provided at both sides of said interdigital transducer and having an antiresonant frequency which is substantially the same as a resonant frequency of said at least one first one-port SAW resonator;

wherein a distance between the interdigital transducer and the reflectors of said second one-port SAW resonator is specified such that a spurious component is generated in said second one-port SAW resonator between the resonant frequency of said second one-port SAW resonator and the transmission band of said surface acoustic wave filter.

2. A surface acoustic wave filter according to claim 1, wherein said distance between the interdigital transducer and the reflectors is set to less than 0.50$\lambda$ where $\lambda$ indicates a wavelength of a surface acoustic wave specified by a pitch between electrode fingers in the interdigital transducer.

3. A surface acoustic wave filter according to claim 2, wherein said distance is measured between the center of the electrode finger in the interdigital transducer of said second one-port SAW resonator which is the closest electrode to one of said reflectors and the center of the electrode finger in the reflector which is the closest electrode to the interdigital transducer.

4. A surface acoustic wave filter according to claim 2, wherein said at least one first one-port SAW resonator further comprises reflectors provided at both sides of said interdigital transducer and spaced therefrom by a distance of substantially 0.50$\lambda$.

5. A surface acoustic wave filter according to claim 2, wherein said first and said second one-port SAW resonators are all formed on a single surface-wave substrate.

6. A surface acoustic wave filter according to claim 1, wherein said first and said second one-port SAW resonators are all formed on a single surface-wave substrate.

7. A surface acoustic wave filter having a ladder-shaped equivalent circuit, comprising:

a series arm between an input and an output, and at least one parallel arm between said series arm and a reference voltage;

said series arm including at least one first one-port SAW resonator including an interdigital transducer;

said at least one parallel arm including a second one-port SAW resonator including an interdigital transducer and reflectors provided at both sides of said interdigital transducer and having an antiresonant frequency which is substantially the same as a resonant frequency of said at least one first one-port SAW resonator;

wherein a distance between the interdigital transducer and the reflectors of said second one-port SAW resonator is specified such that a spurious component is generated in said second one-port SAW resonator between the antiresonant frequency of said first one-port SAW resonator and the transmission band of said surface acoustic wave filter.

8. A surface acoustic wave filter according to claim 7, wherein said distance between the interdigital transducer and the reflectors is set to more than 0.50λ where λ indicates a wavelength of a surface acoustic wave specified by a pitch between electrode fingers in the interdigital transducer.

9. A surface acoustic wave filter according to claim 8, wherein said distance is measured between the center of the electrode finger in the interdigital transducer of said second one-port SAW resonator which is the closest electrode to one of said reflectors and the center of the electrode finger in the reflector which is the closest electrode to the interdigital transducer.

10. A surface acoustic wave filter according to claim 8, wherein said at least one first one-port SAW resonator further comprises reflectors provided at both sides of said interdigital transducer and spaced therefrom by a distance of substantially 0.50λ.

11. A surface acoustic wave filter according to claim 8, wherein said first and said second one-port SAW resonators are all formed on a single surface-wave substrate.

12. A surface acoustic wave filter according to claim 7, wherein said first and said second one-port SAW resonators are all formed on a single surface-wave substrate.

* * * * *